United States Patent
Lal et al.

(10) Patent No.: US 11,901,858 B2
(45) Date of Patent: Feb. 13, 2024

(54) MULTIMODE ENERGY HARVESTING DEVICE

(71) Applicant: X DEVELOPMENT LLC, Mountain View, CA (US)

(72) Inventors: Amit Lal, Ithaca, NY (US); Dean Kawaguchi, San Jose, CA (US); Brion Koprowski, Boulder, CO (US)

(73) Assignee: X DEVELOPMENT LLC, Mountain View, CA (US)

( * ) Notice: Subject to any disclaimer, the term of this patent is extended or adjusted under 35 U.S.C. 154(b) by 105 days.

(21) Appl. No.: 17/514,230

(22) Filed: Oct. 29, 2021

(65) Prior Publication Data
US 2023/0137071 A1 May 4, 2023

(51) Int. Cl.
*H02S 40/38* (2014.01)
*H01L 31/18* (2006.01)
(Continued)

(52) U.S. Cl.
CPC .......... *H02S 40/38* (2014.12); *G06K 7/10237* (2013.01); *H01L 31/1876* (2013.01);
(Continued)

(58) Field of Classification Search
CPC ..... H02S 40/38; H02S 10/30; G06K 7/10237; H02N 2/186
(Continued)

(56) References Cited

U.S. PATENT DOCUMENTS 7,414,351 B2 * 8/2008 Ulm .................. H02N 2/22
310/330
8,344,293 B1 * 1/2013 McCabe ............. H02S 20/30
219/482
(Continued)

FOREIGN PATENT DOCUMENTS

KR 20170075318 A 7/2017
WO 2021126958 A1 6/2021
WO WO-2021126958 A1 * 6/2021 ............. G01D 11/00

OTHER PUBLICATIONS

Panda, Prasanta, et al. (2015). Piezoelectric Energy Harvesting Using PZT Bimorphs and Multilayered Stacks. Journal of Electronic Materials. 44. 10.1007/s11664-015-3959-2.
(Continued)

*Primary Examiner* — Paultep Savusdiphol
(74) *Attorney, Agent, or Firm* — Botos Churchill IP Law

(57) ABSTRACT

An energy harvesting tape comprising a plurality of flexible layers. The plurality of flexible layers includes a solar cell layer configured to capture solar energy, a thermoelectric layer configured to capture thermal energy, one or more piezoelectric layers configured to capture mechanical energy; and an electrode layer configured to capture radiofrequency energy and to transmit a radiofrequency signal. The energy harvesting tape also includes one or more processing units on at least one of the plurality of flexible layers. The one or more processing units are configured to use the captured energy from the plurality of flexible layers to transmit the radiofrequency signal. The energy harvesting
(Continued)

400 tape has a length, a width, and a thickness, where the length is greater than the width, and the width is greater than the thickness.

20 Claims, 7 Drawing Sheets

(51) Int. Cl.
    *G06K 7/10*     (2006.01)
    *H02S 10/30*     (2014.01)
    *H02N 2/18*     (2006.01)
    *H02J 7/35*     (2006.01)

(52) U.S. Cl.
    CPC ............ *H02N 2/186* (2013.01); *H02S 10/30* (2014.12); *H02J 7/35* (2013.01)

(58) Field of Classification Search
    USPC ........................................................ 235/492
    See application file for complete search history.

(56) References Cited

U.S. PATENT DOCUMENTS

| | | | |
|---|---|---|---|
| 9,118,000 B2 | 8/2015 | Kang et al. | |
| 9,780,698 B2 | 10/2017 | Lee et al. | |
| 9,837,570 B2 | 12/2017 | Retti | |
| 10,952,029 B1 | 3/2021 | Kawaguchi et al. | |
| 2005/0005962 A1* | 1/2005 | Clifton | H02S 40/38 136/251 |
| 2011/0233932 A1* | 9/2011 | Zawoy | H01M 16/00 320/101 |
| 2014/0041705 A1* | 2/2014 | Kang | H10N 10/10 136/246 |
| 2015/0076964 A1* | 3/2015 | Madani | H10N 15/00 310/319 |
| 2018/0083569 A1* | 3/2018 | Heppner | H01L 31/0504 |
| 2019/0079316 A1* | 3/2019 | Ballet | G02C 7/083 |
| 2019/0221891 A1* | 7/2019 | Lockett | H01M 6/40 |

OTHER PUBLICATIONS

Pinuela, Manuel & Mitcheson, Paul & Lucyszyn, Stepan. (2013). Ambient RF Energy Harvesting in Urban and Semi-Urban Environments. IEEE Transactions on Microwave Theory and Techniques. 61. 2715-2726. 10.1109/TMTT.2013.2262687.
International Search Report and Written Opinion for Application No. PCT/US2022/043986 dated Jan. 3, 2023 (8 pages).

\* cited by examiner

MULTIMODE ENERGY HARVESTING DEVICE

BACKGROUND

The Internet of Things (IoT) is the inter-networking of physical objects, such as products, packages, vehicles, buildings, etc., that are embedded with electronic components for network connectivity. The embedded components enable objects to detect others, be detected by others, collect data and/or transmit data. In some examples, the embedded components may include tags or labels attached to the physical objects. These tags or labels may be passive or active. The inter-networking capabilities may be leveraged for tracking locations of physical objects.

BRIEF SUMMARY

Aspects of the disclosure provide for an energy harvesting tape. The energy harvesting tape includes a plurality of flexible layers and one or more processing units on at least one of the plurality of flexible layers. The plurality of flexible layers includes a solar cell layer configured to capture solar energy, a thermoelectric layer configured to capture thermal energy, one or more piezoelectric layers configured to capture mechanical energy; and an electrode layer configured to capture radiofrequency energy and to transmit a radiofrequency signal. The one or more processing units are configured to use the captured energy from the plurality of flexible layers to transmit the radiofrequency signal. The energy harvesting tape has a length, a width, and a thickness, where the length is greater than the width, and the width is greater than the thickness.

In one example, the energy harvesting tape also includes an energy storage device. In this example, the energy storage device is optionally attached to a first end of the energy harvesting tape. Also in this example, the energy storage device is optionally included on one of the plurality of flexible layers. Further in this example, the energy storage device optionally includes a rechargeable printed battery. Still further in this example, the energy harvesting tape also includes a rectification circuit between the plurality of flexible layers and the energy storage device.

In another example, the electrode layer includes an antenna. In this example, the energy harvesting tape also optionally includes a first electrode pair between the electrode layer and an energy storage device and a second electrode pair between the electrode layer and the antenna. In a further example, the energy harvesting tape also includes an attachment means on an edge of a first end and an edge of a second end opposite the first end, where the attachment means is configured to couple to a surface. In this example, the energy harvesting tape is optionally configured to vibrate when the attachment means is coupled to the surface.

In yet another example, the electrode layer is configured to capture multi-band radiofrequency energy.

In a still further example, the transmitted radiofrequency signal is a multi-band radiofrequency signal. In another example, the one or more processing units are configured to transmit the radiofrequency signal that can power a set of identifying passive tags. In a further example, the energy harvesting tape is configured to be stored in a roll. In yet another example, the plurality of flexible layers is assembled directly atop one another. In a still further example, the energy harvesting tape also includes one or more adhesive layers between the plurality of flexible layers.

Other aspects of the disclosure provide for a kit. The kit includes the energy harvesting tape described above; a plurality of identifying passive tags; and a reader including one or more computing devices configured to detect the signal emitted by the plurality of identifying passive tags.

Further aspects of the disclosure provide for a method of manufacturing an energy harvesting tape. The method includes constructing a plurality of energy harvesting layers for a flexible tape segment using one or more roll-to-roll processing techniques, where the plurality of energy harvesting layers includes a solar cell layer configured to capture solar energy, a thermoelectric layer configured to capture thermal energy, and one or more piezoelectric layers configured to capture mechanical or radiofrequency energy and to transmit a radiofrequency signal; and assembling the plurality of energy harvesting layers directly atop one another to form the energy harvesting tape having a length, a width, and a thickness, where the length is greater than the width, and the width is greater than the thickness.

In one example, constructing the one or more piezoelectric layers further includes attaching one or more processing units on a first piezoelectric layer. In another example, the method also includes determining the length of the energy harvesting tape based on a target frequency for capture.

DETAILED DESCRIPTION

Overview

Figure 1A:
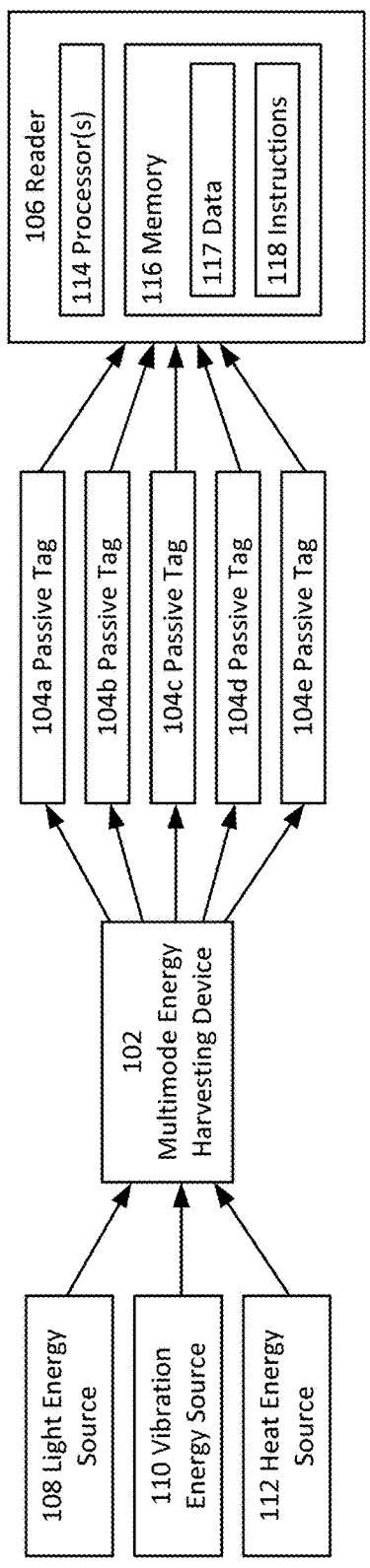
FIG. 1A is a functional diagram of an example system including a multimode energy harvesting device in accordance with aspects of the disclosure.

The technology relates to a multimode energy harvesting tape that is designed to harvest energy of all different forms and enrich the radiofrequency (RF) environment. The tape may be used in a tracking system that includes identifiers or other tracking devices that are passively powered using the radiofrequency signal output by the tape. Using the tape in the tracking system means the energy harvesting module of the passive identifiers or tracking devices may be simplified or may have more flexibility with respect to form. The size and the cost of the identifiers or tracking devices may also be reduced.

The tracking system may include one or more tape segments, a plurality of passive tags, and a reader. Each passive tag may be attached to an item to be tracked, like a package. The one or more tape segments may be attached to an environment for the item, such as an interior wall of a delivery truck or warehouse. In some implementations, the tracking system may further include a central server and an application that may be installed on one or more client devices and may access the central server. The reader may track the passive tags and transmit data to the central server through a network, and the client devices may access the central server through the network.

Each tape segment may have a plurality of layers that define the thickness of the tape. The plurality of layers may include a solar cell layer configured to capture solar energy, a thermoelectric layer to capture thermal energy through temperature gradients, one or more piezoelectric layers to capture mechanical (vibration), and/or one or more electrode layers to capture radiofrequency energy. The one or more electrode layers may include one or more electrodes, a radiofrequency complementary metal-oxide-semiconductor (RF CMOS), diodes and/or piezoelectric components. In some implementations, the one or more electrode layers may include one or more integrated circuit layers. In some cases, a given tape segment may have a single layer that is configured as more than one type of layer (solar cell, thermoelectric, piezoelectric, or electrode). The captured radiofrequency energy may be multi-band radiofrequency energy. At least one of the plurality of layers may also include an energy storage device, such as one or more capacitors or a rechargeable printed battery. One of the aforementioned layers may also include one or more antennas and one or more processing units configured to receive energy captured by the plurality of layers, rectify the energy, store the energy, and/or outputting an RF signal. For capturing multi-band radiofrequency energy, the antenna may include one or more multi-band antennas. In some implementations, the layer including the antenna and the one or more processing units may also be one of the electrode layers. In other implementations, the layer including the antenna and the one or more processing units may also be the solar layer, the thermoelectric layer, or one of the piezoelectric layers.

One or more of the layers may be manufactured using one or more techniques from roll-to-roll (R2R) processing. The manufacturing process of each layer may include performing steps related to deposition of insulating, conducting, piezoelectric, and/or thermoelectric materials, imprinting, and etching. The layers may be assembled to each other, such as with an adhesive, with one layer directly atop another to form the tape segment. Installing the tape segment may include adhering the first end and the second end of the tape to a surface, such as the side of a delivery truck or a wall on the warehouse.

The multimode energy harvesting tape described herein increases the utility of passive tracking devices. Because some of the energy harvesting function of a passive identifier can be removed, the form and function of the passive identifier becomes more flexible. By collecting more than one kind of energy, the tape can enrich the radiofrequency environment to provide more consistent power to the passive identifiers, which increases detectability and improves tracking.

Example Systems

Figure 1B:
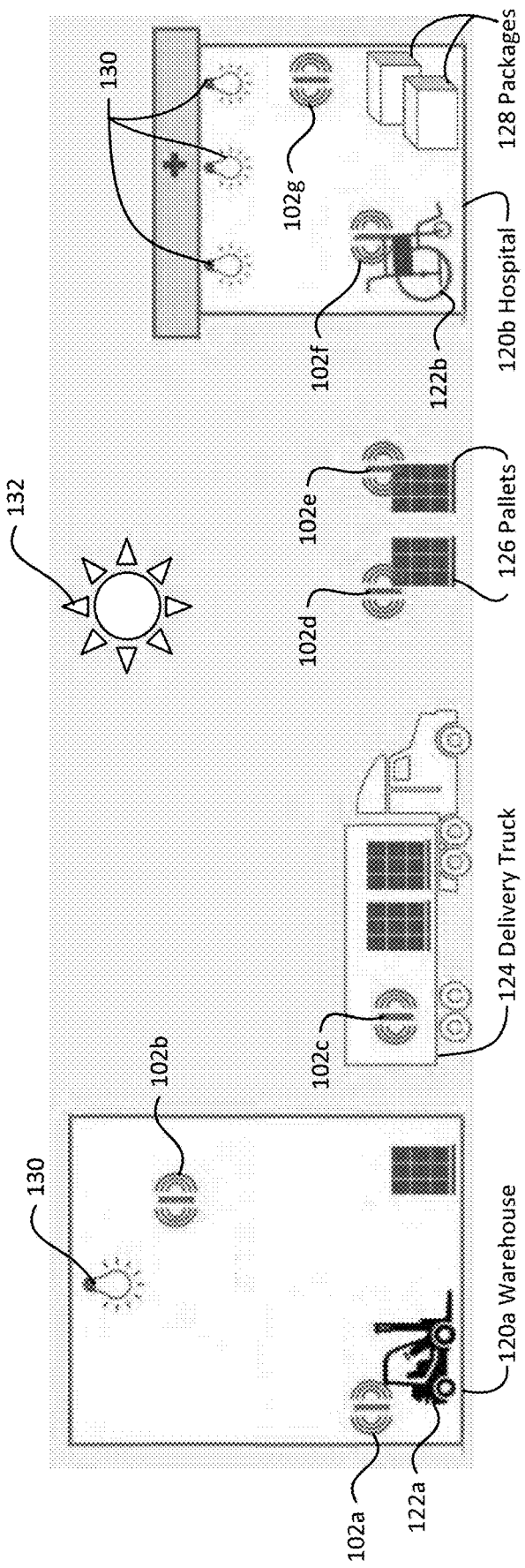
FIG. 1B shows pictorial diagrams of various environments in which the example system is deployed in accordance with aspects of the disclosure.

FIGS. 1A and 1B are functional and pictorial diagrams of a tracking system 100 employed in various environments. The tracking system 100 may include one or more multimode energy harvesting devices 102, such as one or more tape segments, a plurality of passive tags 104 (such as identifier chips), and a reader 106. Each passive tag may be attached to an item to be tracked, like a package. The one or more multimode energy harvesting devices 102 may be configured to capture, or harvest, energy from sources in their environments. For example, the sources may include a light energy source 108, a vibration energy source 110, or a heat energy source 112, among others.

The one or more multimode energy harvesting devices 102 may be installed in an area through which an item having a passive tag is to be tracked. For example, a tape segment 102 may be installed on an interior wall of a building 120, surface of transport vehicle 122 in a building, interior of delivery truck 124, surface of pallets 126, or on outer surfaces of packages 128. As shown in FIG. 1B, tape segments 102a, 102b may be installed in a warehouse 120a, which includes a light source 130 and has a forklift 122a. The tape segment 102a may be attached to the forklift 122a, and the tape segment 102b may be attached to an interior wall of the warehouse 120a. Being on the forklift 122a, the tape segment 102a may receive light energy when light from the light source 130 reaches the tape segment 102a, as well as vibration energy from the movement of the forklift 122a. Being on the wall, the tape segment 102b may receive light energy from the light source 130, and receive it more directly than the tape segment 102a does. Tape segment 102c may be installed on an interior wall of a delivery truck 124. From the interior of the delivery truck, the tape segment 102c may receive vibration energy from the movement of the delivery truck 124. Tape segments 102d, 102e may be installed on pallets 126. When the pallets 126 are being moved, such as on a forklift 122a or delivery truck 124, the tape segments 102d, 102e may receive vibration energy. When the pallets 126 are placed outside, such as on an airport tarmac, the tape segments 102d, 102e may receive light energy from the Sun 132 or other nearby light sources, as well as heat energy from a temperature gradient caused by the Sun 132. Tape segments 102f, 102g may be installed in a hospital 120b, which includes packages 128, light sources 130, wheelchair 122b. The tape segment 102f may be attached to the wheelchair 122b, and the tape segment 102g may be attached to an interior wall of the hospital 120b. Being on the wheelchair 122b, the tape segment 102f may receive light energy when light from the light source 130 reaches the tape segment 102f, as well as vibration energy from the movement of the wheelchair 122b. Being on the wall, the tape segment 102g may receive light energy from the light source 130, and receive it more directly than the tape segment 102f does. In some examples, tape segments 102b, 102g may be placed on the wall near a heating or cooling vent that creates a temperature gradient on the tape segments 102b, 102g to allow for capturing heat energy.

After capturing energy from their environment, the one or more multimode energy harvesting devices 102 may transmit a RF signal into the environment for the plurality of passive tags 104. The signal may be a particular band that can power the plurality of passive tags 104, and as a result, may add to the available power for the plurality of passive tags 104 in the environment. When powered, the plurality of passive tags 104 may emit a signal to indicate a respective location. The reader 106 may be a computing device configured to detect the signal emitted by the plurality of passive tags 104, then store and/or transmit data related to the locations of the detected tags. The reader 106 may include one or more processors 114, memory 116 and other components typically present in general purpose computing devices.

The one or more processors 114 may be any conventional processors, such as commercially available CPUs. Alternatively, the one or more processors may be a dedicated device such as an ASIC or other hardware-based processor, such as a field programmable gate array (FPGA). Although FIG. 1 functionally illustrates the processor(s), memory, and other elements of the reader 106 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of the reader 106. Accordingly, references to a processor or computing device will be understood to include references to a collection of processors or computing devices or memories that may or may not operate in parallel.

The memory 116 stores information accessible by the one or more processors 114, including data 117 and instructions 118 that may be executed or otherwise used by the processor(s) 114. The memory 116 may be of any type capable of storing information accessible by the processor(s), including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The data 117 may be retrieved, stored or modified by processor(s) 114 in accordance with the instructions 118. For instance, although the claimed subject matter is not limited by any particular data structure, the data may be stored in computing device registers, in a relational database as a table having a plurality of different fields and records, XML documents or flat files. The data may also be formatted in any computing device-readable format.

The instructions 118 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

Figure 2:
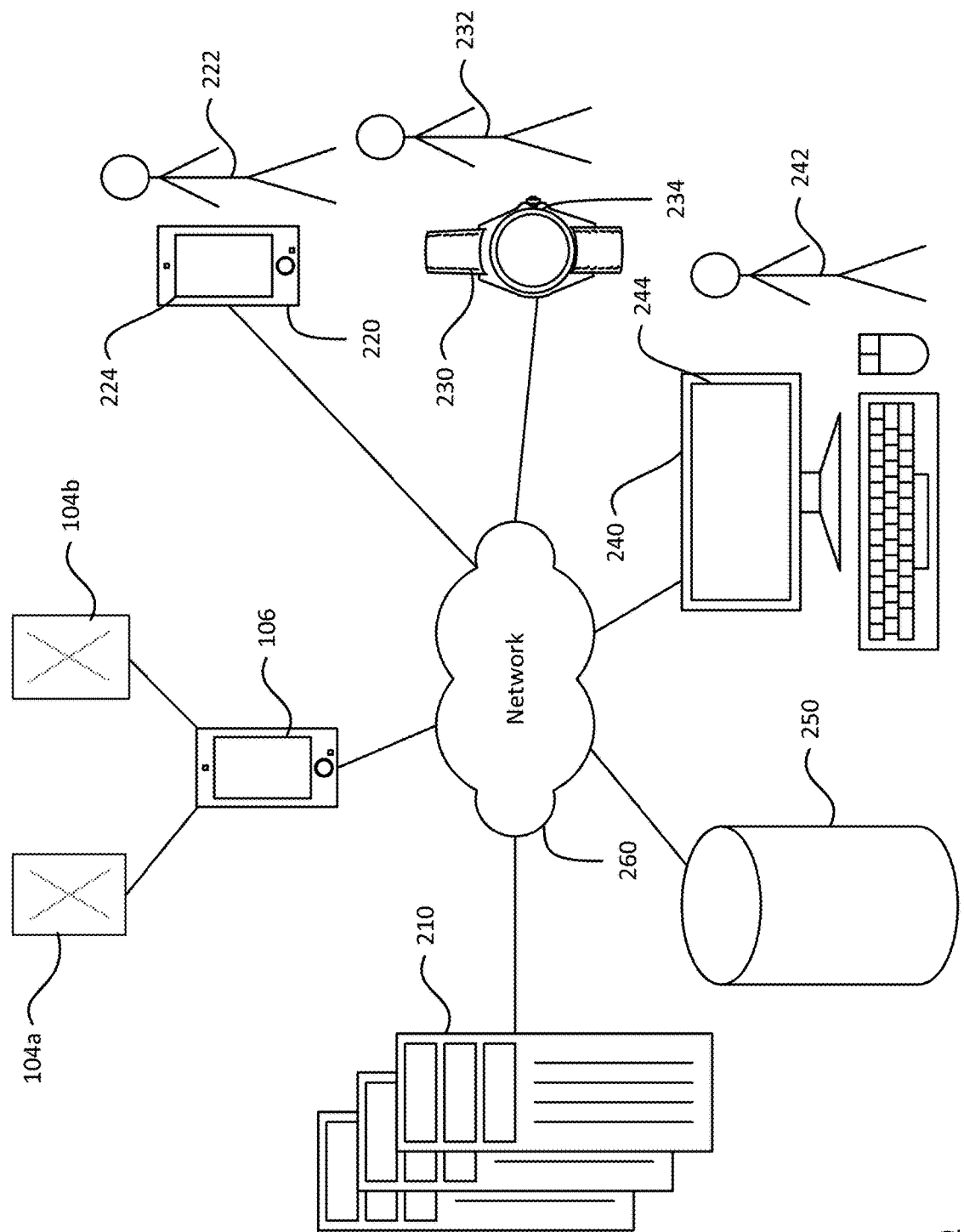
FIG. 2 is a pictorial diagram of an example network in accordance with aspects of the disclosure.
Figure 3:
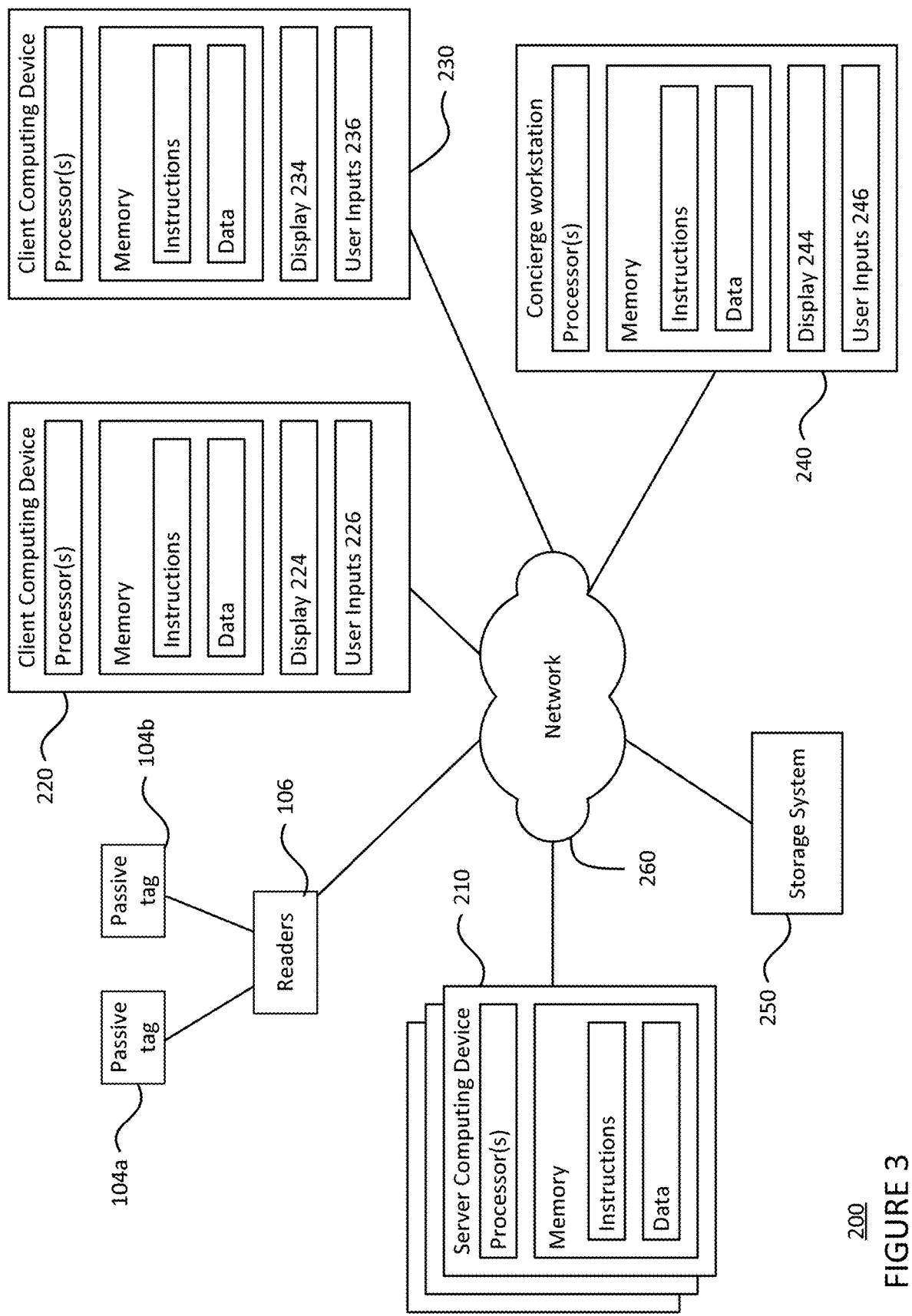
FIG. 3 is a functional diagram of the example network in FIG. 2 in accordance with aspects of the disclosure.

FIGS. 2 and 3 are pictorial and functional diagrams, respectively, of an example system 200 that includes a plurality of computing devices 210, 220, 230, 240 and a storage system 250 connected via a network 260. System 200 also includes passive tags 104a, 104b and reader 106. Although only a few tags and computing devices are depicted for simplicity, a typical system may include significantly more.

In some implementations, the tracking system 100 may further include a central server, such as one or more server computing devices 210, and an application that may be installed on one or more client computing devices 220, 230, 240 and may access the central server 210. After detecting location of passive tags 104, the reader 106 may transmit the location data to the central server 210 through the network 260. The client computing devices 220, 230, 240 may access the location data on the central server 210 through the network 260.

Using the client computing devices, users, such as user 222, 232, 242, may view the location data on a display, such as displays 224, 234, 244 of computing devices 220, 230, 240. As shown in FIG. 3, each client computing device 220, 230, 240 may be a personal computing device intended for use by a user 222, 232, 242, and have all of the components normally used in connection with a personal computing device including a one or more processors (e.g., a central processing unit (CPU)), memory (e.g., RAM and internal hard drives) storing data and instructions, a display such as displays 224, 234, 244 (e.g., a monitor having a screen, a touch-screen, a projector, a television, or other device that is operable to display information), and user input devices 226, 236, 246 (e.g., a mouse, keyboard, touch screen or microphone). The client computing devices may also include speakers, a network interface device, and all of the components used for connecting these elements to one another.

Although the client computing devices 220, 230, and 240 may each comprise a full-sized personal computing device, they may alternatively comprise mobile computing devices capable of wirelessly exchanging data with a server over a network such as the Internet. By way of example only, client computing device 220 may be a mobile phone or a device such as a wireless-enabled PDA, a tablet PC, a wearable computing device or system, or a netbook that is capable of obtaining information via the Internet or other networks. In another example, client computing device 230 may be a wearable computing system, shown as a wristwatch in FIG. 2. As an example, the user may input information using a small keyboard, a keypad, microphone, using visual signals with a camera, or a touch screen.

Figure 4A:
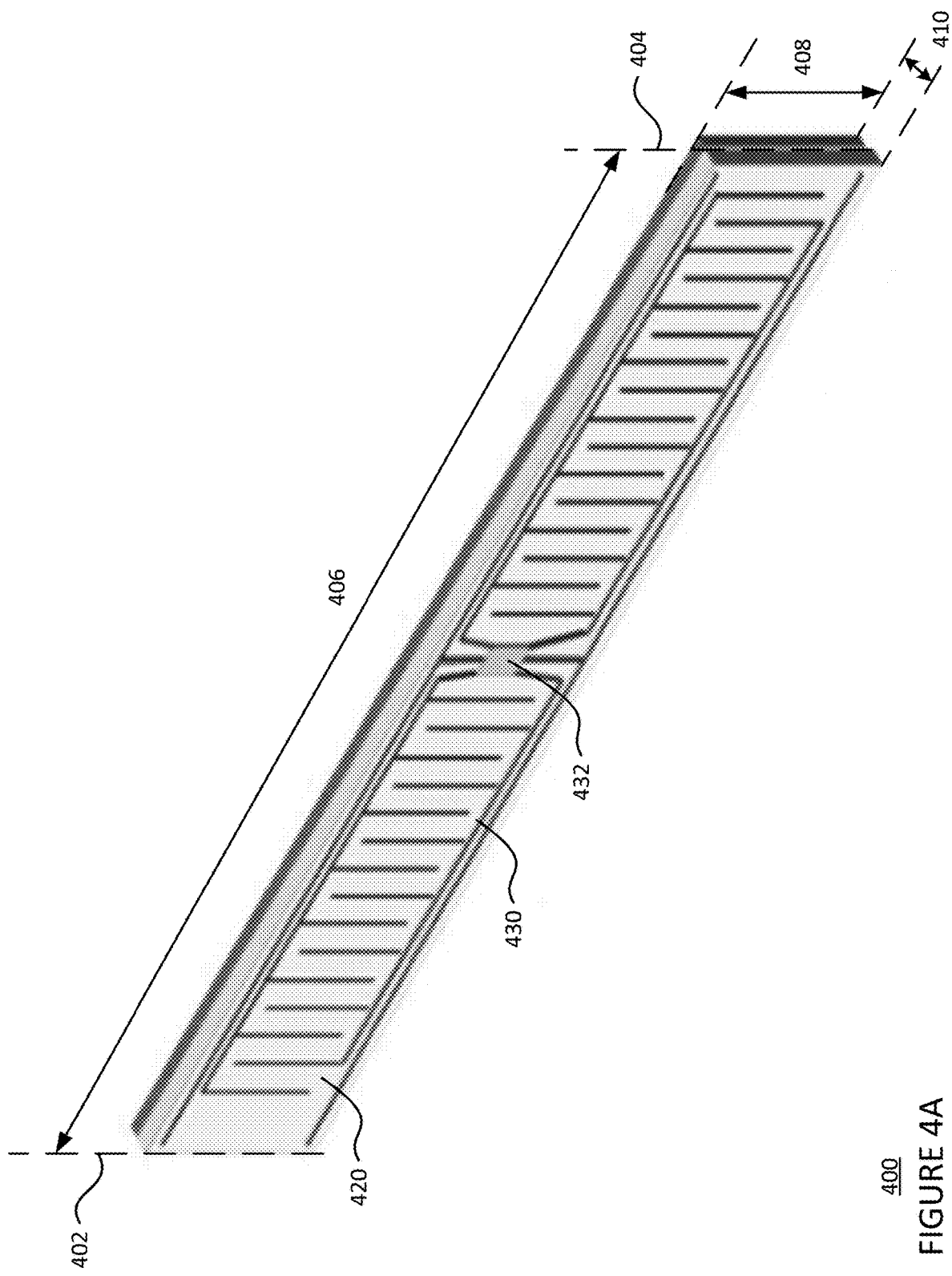
FIG. 4A is a perspective view of a multimode energy harvesting device in accordance with aspects of the disclosure.
Figure 4B:
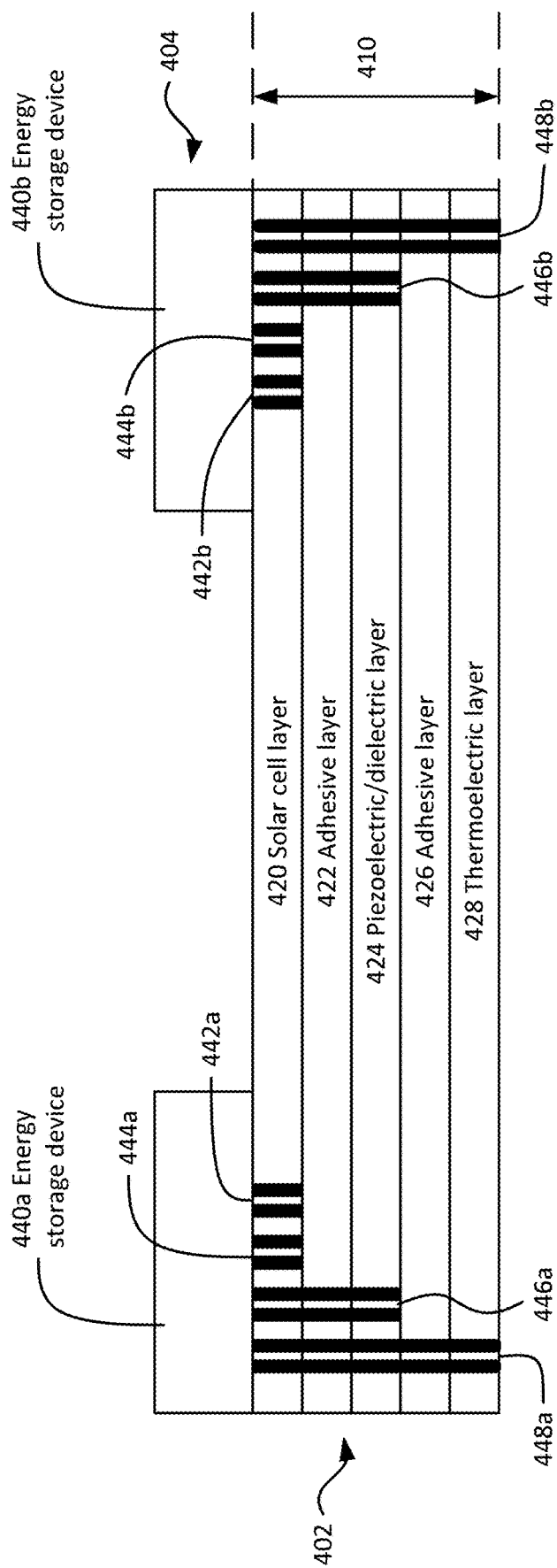
FIG. 4B is a side view of a multimode energy harvesting device in accordance with aspects of the disclosure.
Figure 4C:
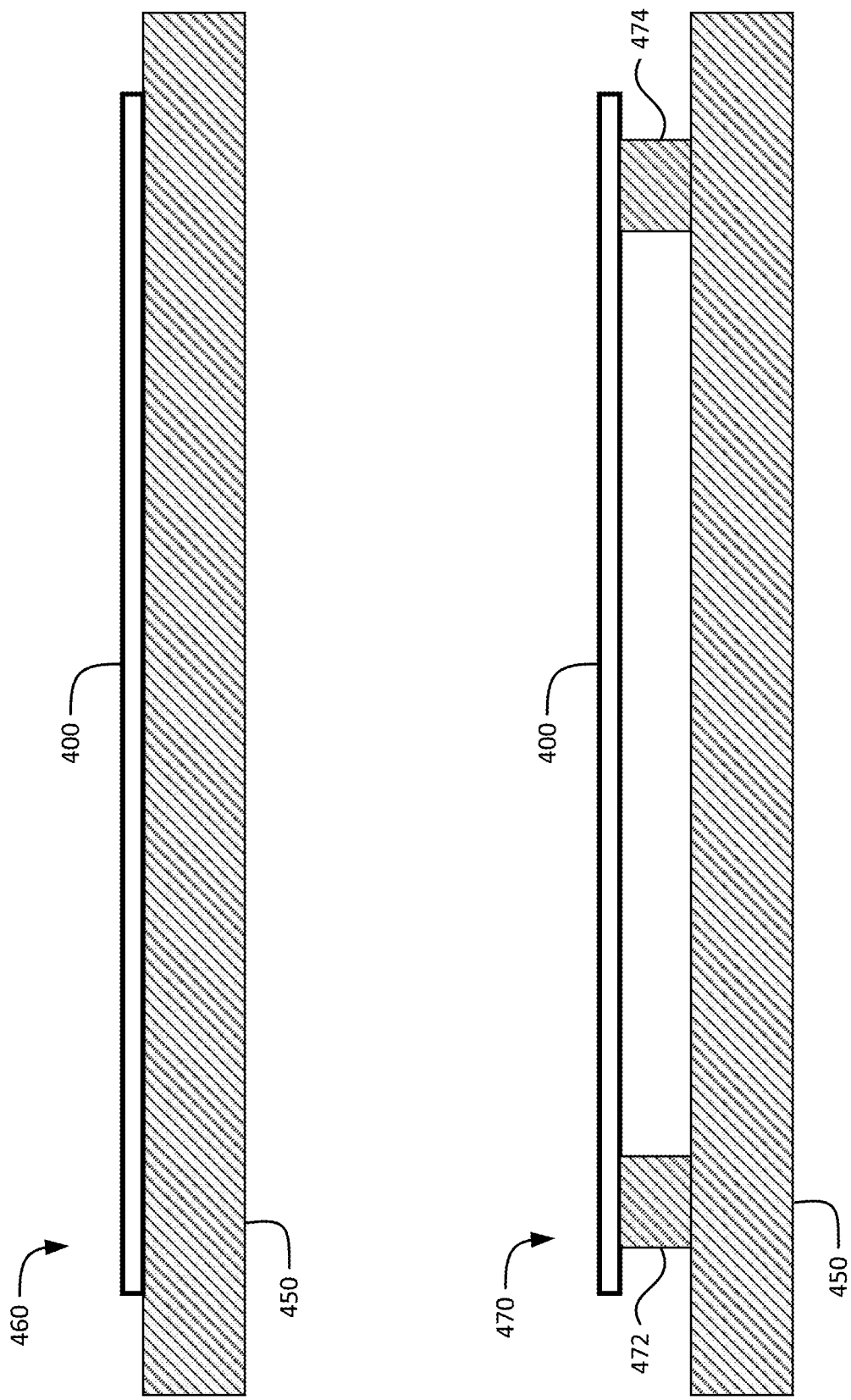
FIG. 4C is another side view of a multimode energy harvesting device in accordance with aspects of the disclosure.

For the one or more multimode energy harvesting devices 102, one or more tape segments may be included, and may be configured as shown in FIGS. 4A-4C and discussed herein. As shown in FIG. 4A, each tape segment 400 may have a first end 402, a second end 404, a length 406 between the first end and the second end, a width 408, and a thickness 410. The length 406 of the tape segment is longer than the width 408. The length 406 of the tape segment may be determined based on a frequency band targeted for capture. For example, the frequency band may include 60 Hz for inductive coupling or be in a radiofrequency range for radiofrequency capture. In some implementations, the length 406 may be determined based on a target area size for semiconductors to be exposed to light for generating a current. The thickness 410 of the tape is smaller than the length 406 and the width 408. For example, the length 406 may be 100 cm, the width 408 may be 15 cm, and the thickness 410 may be at or about 1 mm. In other examples, the thickness 410 may be more or less than 1 mm. In addition, for a given length of a given tape segment, the thickness of the piezoelectric material in the given tape segment may be selected to provide a flexural rigidity that causes the given tape segment to vibrate at a target resonant frequency. The tape segment 400 may be a traditional rectangular shape or be a different type of shape. The material of the tape segment may be flexible and thin. Other tape segments may have different dimensions, shapes, or materials.

Each tape segment 400 may have a plurality of layers that define the thickness 410 of the tape. Each of the plurality of layers may be less than 500 micrometers. The plurality of layers may be configured to capture a wide variety of electromagnetic radiation, such as including radiofrequency wavelengths, infrared wavelengths, optical (visible) wavelengths, ultraviolet wavelengths, x-ray wavelengths, or gamma wavelengths. Different layers may be configured to capture different ranges in electromagnetic radiation. For example, one layer may capture one or more bands of the radiofrequency wavelengths, another layer may capture visible wavelengths, and yet another layer may capture gamma wavelengths. A single layer may also be configured to capture wavelengths in more than one category of electromagnetic radiation.

As shown in FIG. 4B, the plurality of layers may include a first layer 420 configured as a solar cell layer that captures solar energy, a second layer 424 configured as both a piezoelectric layer that captures mechanical (vibration) and/or an electrode layer that captures radiofrequency energy, and a third layer 428 configured as a thermoelectric layer that captures thermal energy. Each of the layers shown in FIG. 4B may be between approximately 100 micrometers and approximately 200 micrometers. One or more additional layers may be included to capture more energy which may be the same or different type of energy as the other layers. In alternative examples, there may be separate layers for the piezoelectric layer and the electrode layer. There may be an adhesive layer between the energy capture layers. For example, adhesive layer 422 may be between solar cell layer 420 and a piezoelectric/electrode layer 424, and adhesive layer 426 may be between piezoelectric/electrode layer 424 and thermoelectric layer 428. One of the aforementioned layers, such as solar cell layer 420 as shown in FIG. 4A, may include an antenna 430 and one or more processing units 432 for outputting a radiofrequency signal. In alternative examples, the antenna 430 and/or the one or more processing units 432 may be included in the piezoelectric/electrode layer 424 or the thermoelectric layer 428.

At least one of the plurality of layers may be attached to an energy storage device, such as one or more capacitors or a rechargeable printed battery. In some examples, the energy storage device may be attached to the plurality of layers near the first end and/or the second end, such as via electrodes. A rectification circuit may be included in the connection between the energy storage device and one or more of the layers to rectify an incoming signal. The rectifying elements may be fabricated by printing semiconductor/metal or semiconductor/metal junctions on a given layer, or rectifying chiplets implemented on silicon chips may be attached to the given layer. The rectification circuit may be configured to shield the impedances of the electrical energy coming from different layers or different sources on each layer from each other, only allowing charge to flow towards the energy storage device. The shielding feature may increase efficiency for collecting/storing energy from different sources with differing impedances. For example, for solar energy, the diodes, such as PN diodes, are typically forward-biased under illumination and have low output impedances. In contrast, piezoelectric vibration harvesters have high output impedances. Alternatively, active switches may be controlled, such as by one or more processing units 432, to switch between connecting different sources to the energy storage device, and the energy storage device may be configured to receive energy from one source at a time.

The one or more energy storage devices may be electrically attached to the antenna in the plurality of layers, such as through electrodes. As shown in FIG. 4B, energy storage devices 440a, 440b may be attached at or near the first end 402 and the second end 404, respectively. Each of the energy storage devices 440 may be electrically attached to the solar cell layer 420 via electrodes pairs 442, 444, one of which may be connected to the antenna 430 in the solar cell layer. In addition, each of the energy storage devices 440 may be electrically attached to the piezoelectric/electrode layer 424 via electrode pair 446 and to the thermoelectric layer 428 via electrode pair 448. Alternatively, the energy storage device may be included on at least one of the plurality of layers. The energy storage device may include a capacitor or a battery.

The one or more processing units 432, such as an integrated circuit, may be configured to receive energy from the plurality of layers, which includes rectifying the energy as needed. For example, the integrated circuit may receive electrical energy generated by each electrode pair 442, 444, 446, 448 and store the received energy using the energy storage device. The one or more processing units 432 may include a plurality of conductive traces that connect to the other components of the tape segment, which may include connecting to vias that pass through layers. The conductive traces may direct energy to the one or more processing units 432 and towards the energy storage device, and may also direct energy towards an antenna 430 for transmitting signals.

For layers where the generated energy require rectification, such as the piezoelectric/electrode layer 424, the electrode pair 446 may be connected to the rectification circuit to rectify the energy before storage. Alternatively, the one or more processing units 432 may control one or more switches to direct energy from different sources towards the energy storage device. The one or more processing units 432 may control the one or more switches based on detected conditions, such as energy levels received at the layers or detected environmental conditions from an energy source related to a type of layer.

Receiving the energy from the plurality of layers may also include summing different power (energy) modes. The method of summing the different power modes may involve storage of the different received energies at an energy storage device, such as energy store devices 440a, 440b or another separate device, before drawing from the stored energy to transmit a signal. The configuration for summing the different power modes may prevent energy stored from a first layer from leaking out to a second layer.

Using the generated electrical energy, the one or more processing units 432 may use the antenna 430 to transmit signals on a particular band associated with the passive tags 104, such as 900 MHz. The one or more processing units 432 may activate the antenna using the electrode pair 442 or 444 connected to the energy storage device 440. Alternatively, the one or more processing units may include discrete circuit components. The one or more processing units 432 may initiate transmission of the signal after a set of conditions is satisfied, such as a threshold amount of energy is received or stored. In some cases, the one or more processing units 432 may select the particular band for the signal based on a target band for the tracking devices, user input, or detected environmental conditions.

Each tape segment may optionally include an adhesive, or another attachment means for attaching the tape segment onto a surface. The adhesive may be added on an outer surface of the tape segment or may be a separate adhesive layer. For example, the adhesive may be on the available surface of thermoelectric layer 428 of tape segment 400 opposite the adhesive layer 426. With this type of adhesive arrangement, the tape segment 400 may be installed on a surface 450, such as a wall, vehicle, pallet, or package, with the entire bottom surface adhered to the surface, as shown in configuration 460 in FIG. 4C. Alternatively, the attachment means may be on the edge of the first end and the edge of the second end of each tape segment. For example, the attachment means, such as a clip or a hook, may be positioned on the first end 402 and the second end 404 of the tape segment 400. With this type of attachment means arrangement, the tape segment 400 may be installed on a surface 450 with the first end 402 and the second end 404 attached to the surface 450, with the rest of the length of tape segment 400 unattached and free to move or vibrate, as shown in configuration 470 in FIG. 4C. In this example, the surface 450 may have attachment means 472, 474 configured to couple with the attachment means on the tape segment 400. The attachment means may be flexible or may otherwise allow the tape segment 400 to flex or vibrate in a desired range.

Example Methods

In addition to the operations described above and illustrated in the figures, various operations will now be described. It should be understood that the following operations do not have to be performed in the precise order described below.

Figure 5:
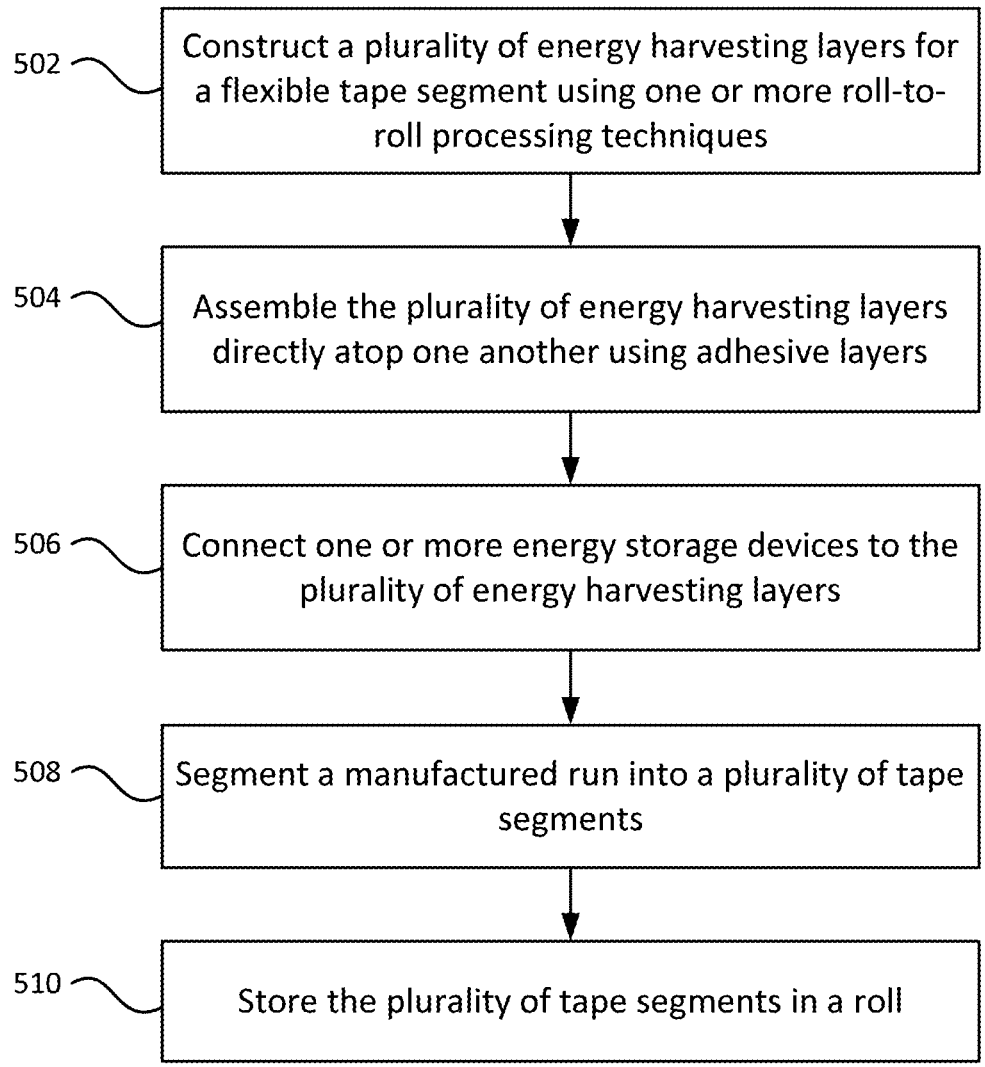
FIG. 5 is a flow diagram of an example method in accordance with aspects of the disclosure.

FIG. 5 is an example flow diagram 500 including a method for manufacturing a tape segment in accordance with some of the aspects described above. The method may be performed by one or more computing devices controlling machinery that is customized for the steps of the method. While FIG. 5 shows blocks in a particular order, the order may be varied and that multiple operations may be performed simultaneously. Also, operations may be added or omitted.

One or more of the layers of the tape segment may be manufactured using one or more techniques from roll-to-roll (R2R) processing, which fabricates flexible electronics. At block 502, each energy harvesting layer of the plurality of layers may be constructed to include the features described above using techniques from R2R processing. In particular, the manufacture of each energy harvesting layer may include performing deposition, imprint, and etch steps of R2R processing. Each energy harvesting layer may be manufactured having a same or similar length based on a predetermined length of the tape segment. In some implementations, the predetermined length of the tape segment may be determined by the one or more computing devices performing the manufacturing based on input indicating a target frequency for energy capture. In other implementations, the predetermined length of the tape segment may additionally or alternatively be determined by the one or more computing devices based on input indicating a target minimum area for semiconductors to be exposed to light for harvesting solar energy or indicating a target amount of current from solar energy. In further implementations, a thickness of piezoelectric materials for the tape segment may be determined by the one or more computing devices based on a target resonant frequency and a selected or determined length of the tape segment. The target resonant frequency or frequency band may be received as input to the one or more computing devices or may be determined by the one or more computing devices based on an input indicating a target flexural rigidity. At block 504, the energy harvesting layers may be assembled to each other with one layer directly atop another using adhesive layers. For example, the solar cell layer 420 may be assembled directly atop piezoelectric/electrode layer 424 using adhesive layer 422, and the piezoelectric/electrode layer 424 may be assembled directly atop the thermoelectric layer 428 using adhesive layer 426. The dimensions and materials for the assembly may be based on the determinations described in block 502. The adhesive layers may be spray-coated. For some tape segments, adhesive may be applied to a given layer before all the layers are constructed at block 502. At block 506, one or more energy storage devices may be connected to the energy harvesting layers. The one or more energy storage devices may include one or more capacitors or a rechargeable printed battery. For some tape segments, the one or more energy storage devices may be constructed as part of the R2R processing at block 502.

In some implementations, a length of more than one tape segment may be manufactured in a run. In these implementations, the method may further include segmenting the manufactured run into a plurality of tape segments at block 508. Some further implementations may include storing the plurality of tape segments in a roll at block 510, such as arranged end-to-end or at least slightly overlapping.

Installing a tape segment may include one or more of the following features. The first end and the second end of the tape segment may be adhered to a surface, such as the side of a delivery truck or a wall on the warehouse. As shown in configuration 460 of FIG. 4C, the whole length of the tape may be adhered to the surface for more stability. Alternatively, the length between first end and second end of the tape segment may not be adhered to the surface, but pulled taut to allow the tape segment to vibrate, as shown in configuration 470 of FIG. 4C. In this manner, the vibration energy may be captured by a piezoelectric layer of the tape segment. The tape segment may be installed in a particular orientation, such as perpendicular or parallel to the ground or a floor of a container or building. In some cases, the first end of the tape segment may be positioned in a warmer location, such as more proximal to a heat source, and the second end may be positioned in a cooler location. Different tape segments may be installed in different orientations.

In some alternative implementations, the plurality of layers may be arranged in different configurations. As such, the alternative implementations may include positioning the layers in non-tape form. For example, the layers may be positioned on surfaces of a box or different containers. The layers may alternatively be positioned independently of one another based on where different types of energy is available. Regardless of form, the layers may be electrically or otherwise operatively coupled to the one or more processing units that are configured to receive, store, rectify, and/or transmit the captured energy.

The multimode energy harvesting tape described herein increases the utility of passive tracking devices. Because some of the energy harvesting function of a passive identifier can be removed, the form and function of the passive identifier becomes more flexible. By collecting more than one kind of energy, the tape is able to enrich the radiofrequency environment to provide more consistent power to the passive identifiers, which increases detectability and improves tracking. For example, the tape may be useful when solar energy is not available, but vibration energy is available, such as inside a packaged box or a palette where light cannot penetrate but vibrations can still be felt during transport or other movements.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. An energy harvesting tape comprising:
   a plurality of flexible layers including:
   a solar cell layer configured to capture solar energy,
   a thermoelectric layer configured to capture thermal energy,
   one or more piezoelectric layers configured to capture mechanical energy; and
   an electrode layer configured to capture radiofrequency energy and to transmit a radiofrequency signal; and
   one or more processing units on at least one of the plurality of flexible layers, the one or more processing units being configured to use the captured energy from the plurality of flexible layers to transmit the radiofrequency signal; and
   wherein the energy harvesting tape has a length, a width, and a thickness, where the length is greater than the width, and the width is greater than the thickness.

2. The energy harvesting tape of claim 1, further comprising an energy storage device.

3. The energy harvesting tape of claim 2, wherein the energy storage device is attached to a first end of the energy harvesting tape.

4. The energy harvesting tape of claim 2, wherein the energy storage device is included on one of the plurality of flexible layers.

5. The energy harvesting tape of claim 2, wherein the energy storage device includes a rechargeable printed battery.

6. The energy harvesting tape of claim 2, further comprising a rectification circuit between the plurality of flexible layers and the energy storage device.

7. The energy harvesting tape of claim 1, wherein the electrode layer includes an antenna.

8. The energy harvesting tape of claim 7, further comprising a first electrode pair between the electrode layer and an energy storage device and a second electrode pair between the electrode layer and the antenna.

9. The energy harvesting tape of claim 1, further comprising an attachment means on an edge of a first end and an edge of a second end opposite the first end, the attachment means being configured to couple to a surface.

10. The energy harvesting tape of claim 9, wherein the energy harvesting tape is configured to vibrate when the attachment means is coupled to the surface.

11. The energy harvesting tape of claim 1, wherein the electrode layer is configured to capture multi-band radiofrequency energy.

12. The energy harvesting tape of claim 1, wherein the transmitted radiofrequency signal is a multi-band radiofrequency signal.

13. The energy harvesting tape of claim 1, wherein the one or more processing units are configured to transmit the radiofrequency signal that can power a set of identifying passive tags.

14. The energy harvesting tape of claim 1, wherein the energy harvesting tape is configured to be stored in a roll.

15. The energy harvesting tape of claim 1, wherein the plurality of flexible layers is assembled directly atop one another.

16. The energy harvesting tape of claim 1, further comprising one or more adhesive layers between the plurality of flexible layers.

17. A kit comprising:
   the energy harvesting tape of claim 1;
   a plurality of identifying passive tags; and
   a reader including one or more computing devices configured to detect signals emitted by the plurality of identifying passive tags.

18. A method of manufacturing an energy harvesting tape, the method comprising:
   constructing a plurality of energy harvesting layers for a flexible tape segment using one or more roll-to-roll processing techniques, the plurality of energy harvesting layers including:
   a solar cell layer configured to capture solar energy,
   a thermoelectric layer configured to capture thermal energy, and
   one or more piezoelectric layers configured to capture mechanical or radiofrequency energy and to transmit a radiofrequency signal; and
   assembling the plurality of energy harvesting layers directly atop one another to form the energy harvesting tape having a length, a width, and a thickness, where the length is greater than the width, and the width is greater than the thickness.

19. The method of manufacturing in claim 18, wherein constructing the one or more piezoelectric layers further includes attaching one or more processing units on a first piezoelectric layer.

20. The method of manufacturing in claim 18, further comprising determining the length of the energy harvesting tape based on a target frequency for capture.

* * * * *